(12) United States Patent
Perlov et al.

(10) Patent No.: US 6,393,337 B1
(45) Date of Patent: May 21, 2002

(54) METHOD AND APPARATUS FOR ORIENTING SUBSTRATES

(75) Inventors: Ilya Perlov; Eugene Gantvarg, both of Santa Clara; Leonid Tertitski, San Jose, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/482,362

(22) Filed: Jan. 13, 2000

(51) Int. Cl.$^7$ .............................. G06F 7/00; B65G 49/07
(52) U.S. Cl. .................. 700/229; 414/757; 414/936; 414/938
(58) Field of Search .................. 700/229; 414/757, 414/777, 754, 936, 938; 118/728

(56) References Cited

U.S. PATENT DOCUMENTS

| | | | | |
|---|---|---|---|---|
| 3,982,627 A | * | 9/1976 | Isohata | 414/757 X |
| 4,892,455 A | * | 1/1990 | Hine | 414/757 X |
| 5,183,378 A | * | 2/1993 | Asano et al. | 414/757 X |
| 5,382,806 A | * | 1/1995 | Bacchi et al. | 414/938 X |
| 5,533,243 A | * | 7/1996 | Asano | 414/936 X |
| 5,853,284 A | * | 12/1998 | Ohzeki et al. | 414/757 X |
| 6,027,301 A | * | 2/2000 | Kim et al. | 414/936 X |
| 6,203,268 B1 | * | 3/2001 | Miyashita et al. | 414/757 X |
| 6,222,339 B1 | * | 4/2001 | Yamasaki et al. | 414/777 X |
| 6,270,307 B1 | * | 8/2001 | Sinha | 414/754 X |

\* cited by examiner

Primary Examiner—Christopher P. Ellis
Assistant Examiner—Gene O. Crawford
(74) Attorney, Agent, or Firm—Dugan & Dugan LLP

(57) ABSTRACT

A multiple substrate orienter is provided that includes a rotatable substrate handler having a plurality of substrate support portions, each adapted to support a substrate. The multiple substrate orienter also includes a plurality of stacked substrate supports, each adapted to support a substrate. A plurality of substrate orientation marking (SOM) detectors are provided, and each SOM detector is coupled to a different one of the substrate supports and is adapted to identify a presence of an SOM of a substrate positioned close enough to the SOM detector to allow SOM detection by the SOM detector. The multiple substrate orienter further includes a plurality of lift and lower mechanisms, each lift and lower mechanism coupled to a different one of the substrate supports and adapted to individually lift and lower the substrate support to which the lift and lower mechanism is coupled. Alternatively, each lift and lower mechanism may be coupled to a different one of the substrate support portions of the rotatable substrate handler and adapted to individually lift and lower the substrate support portion to which the lift and lower mechanism is coupled. Preferably the multiple substrate orienter includes a controller having program code adapted to simultaneously rough orient a plurality of substrates loaded onto the substrate support portions of the substrate handler, and to individually fine orient each rough oriented substrate. In further aspects of the invention, a substrate orienter capable of orienting one or more substrates is provided, as are methods for orienting substrates as described above.

20 Claims, 6 Drawing Sheets

METHOD AND APPARATUS FOR ORIENTING SUBSTRATES

FIELD OF THE INVENTION

The present invention relates to substrate processing (e.g., semiconductor device fabrication, flat panel display fabrication, etc.) and more specifically to a method and apparatus for orienting substrates (e.g., semiconductor wafers, glass substrates for flat panel displays, etc.).

BACKGROUND OF THE INVENTION

Proper alignment or "orientation" of substrates is often required during substrate processing. For example, proper semiconductor wafer orientation is required during processing steps sensitive to wafer orientation (e.g., lithographic processes, masking steps, etc.), for reading information scribed on a wafer's backside (e.g., lot number wafer serial number, etc.) and the like. Accordingly, to identify wafer orientation, semiconductor wafers are provided with a flattened edge region termed a "flat" along an otherwise rounded wafer edge, or a small portion of a wafer's edge is removed to form a "notch" therein.

Conventional wafer orientation devices typically comprise a platform having a rotatable surface, and a wafer orientation sensor (e.g., an optical sensor) positioned a small distance above the platform. To achieve a desired wafer orientation, a wafer is placed on the rotatable surface of the platform, the rotatable surface is rotated (so as to rotate the wafer) and the wafer position sensor is employed to identify when a flat or notch of the wafer is in a predetermined position. The wafer position sensor then transmits this information to the platform to cease wafer rotation. Accordingly, wafer transfer to, wafer orientation by, and wafer transfer from conventional wafer orienting devices follows the same sequence: 1) a wafer handler extracts a first wafer from a multi-slot wafer carrier and transports the first wafer to the wafer orienting device; 2) the wafer orienting device orients the first wafer; and 3) the wafer handler returns the oriented first wafer to the multi-slot wafer carrier. Thereafter the sequence repeats and the wafer handler extracts a second wafer from the multi-slot wafer carrier and transports the second wafer to the wafer orienting device, etc.

As indicated by the sequence described above, conventional wafer orienting devices allow only one wafer to be oriented at a time. Such operation reduces throughput and increases wafer processing costs. Further, expensive and large footprint orienting equipment (e.g., a separate wafer platform, a motor required for rotation thereof, etc.) is also required. Accordingly a need exists for an improved wafer orienting device.

SUMMARY OF THE INVENTION

To address the needs of the prior art, a wafer orienter is provided that can simultaneously orient multiple substrates while occupying a small footprint. A small footprint preferably is achieved primarily by employing equipment already present within most device fabrication tools (e.g., so that the equipment does not consume any additional space) and by implementing the orienter in a compact, vertically stacked configuration. Simultaneous substrate orientation significantly increases substrate throughput, thereby decreasing cost per unit substrate processed. A small footprint further decreases cost per unit substrate processed by reducing cleanroom space requirements.

In accordance with the present invention, a multiple substrate orienter is provided that includes a rotatable substrate handler having a plurality of substrate support portions, each adapted to support a substrate. The multiple substrate orienter also includes a plurality of stacked substrate supports, each adapted to support a substrate. A plurality of substrate orientation marking (SOM) detectors are provided, and each SOM detector is coupled to a different one of the substrate supports and is adapted to identify a presence of an SOM (e.g., a wafer flat or notch) of a substrate positioned close enough to the SOM detector to allow SOM detection by the SOM detector. The multiple substrate orienter further includes a plurality of lift and lower mechanisms, each lift and lower mechanism coupled to a different one of the substrate supports and adapted to individually lift and lower the substrate support to which the lift and lower mechanism is coupled. Alternatively, each lift and lower mechanism may be coupled to a different one of the substrate support portions of the rotatable substrate handler and adapted to individually lift and lower the substrate support portion to which the lift and lower mechanism is coupled.

Preferably the multiple substrate orienter includes a controller coupled to the rotatable substrate handler, to the plurality of SOM detectors and to the plurality of lift and lower mechanisms. The controller preferably has program code adapted to simultaneously rough orient a plurality of substrates loaded onto the substrate support portions of the rotatable substrate handler, and to individually fine orient each rough oriented substrate. As used herein, to "simultaneously rough orient a plurality of substrates" means to perform at least one portion of a rough orientation process simultaneously on the plurality of substrates, although each and every portion of the rough orientation process need not be performed simultaneously on all of the substrates. To "individually fine orient each rough oriented substrate" means to fine orient each rough oriented substrate one substrate at a time (e.g., not simultaneously).

In another aspect of the invention, a substrate orienter is provided the rotatable substrate handler of which has a single substrate support portion adapted to support a single substrate. Both aspects of the invention employ the substrate handler's rotational capability for substrate orienting, and both aspects perform a high speed rough orient which considerably reduces the time required for substrate orienting, as compared to conventional methods.

Other objects, features and advantages of the present invention will become more fully apparent from the following detailed description of the preferred embodiments, the appended claims and the accompanying drawings.

DETAILED DESCRIPTION

Figure 1A:
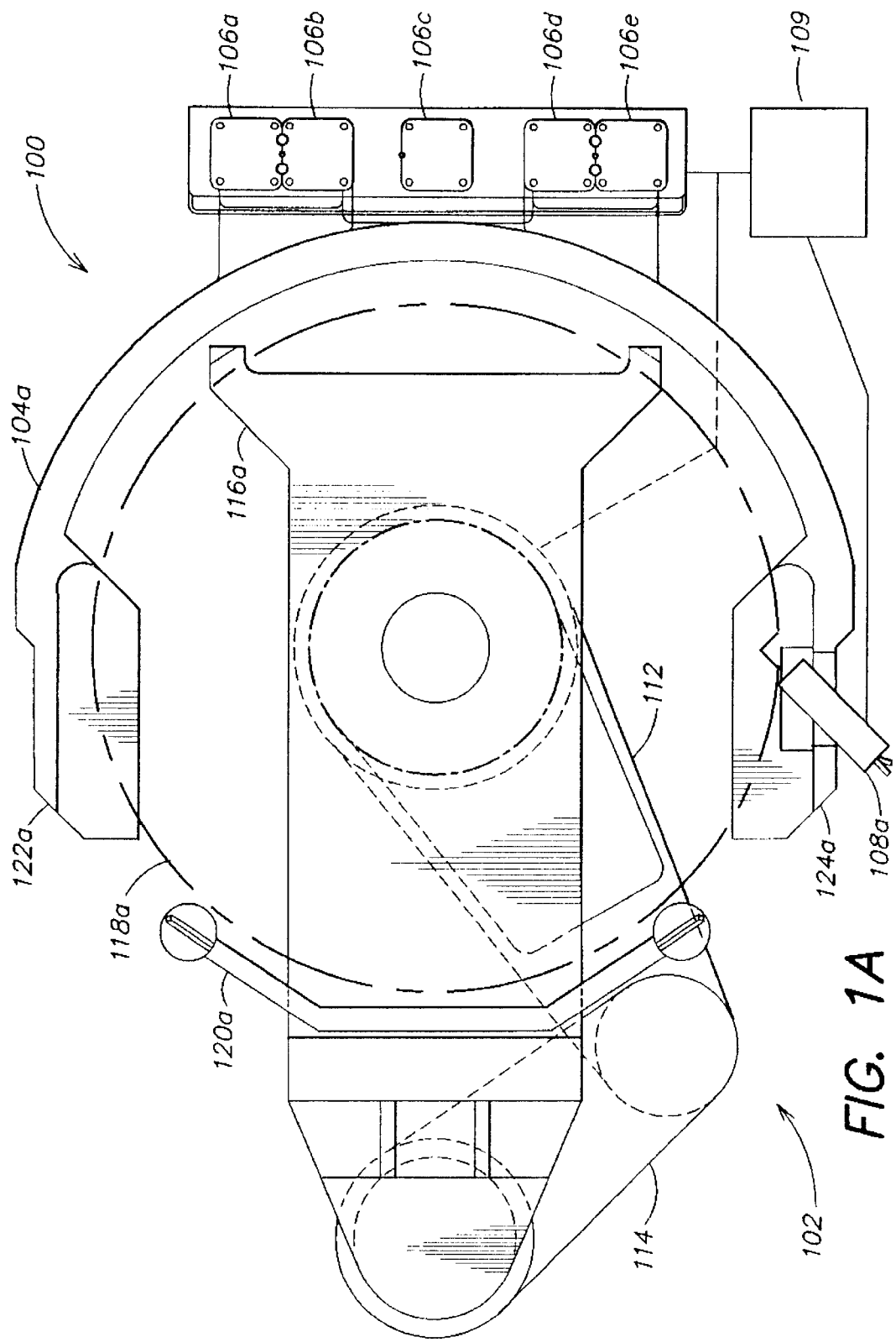
FIGS. 1A and 1B are a top plan view and a side elevational view, respectively, of an inventive multiple substrate orienter configured in accordance with the present invention.
Figure 1B:
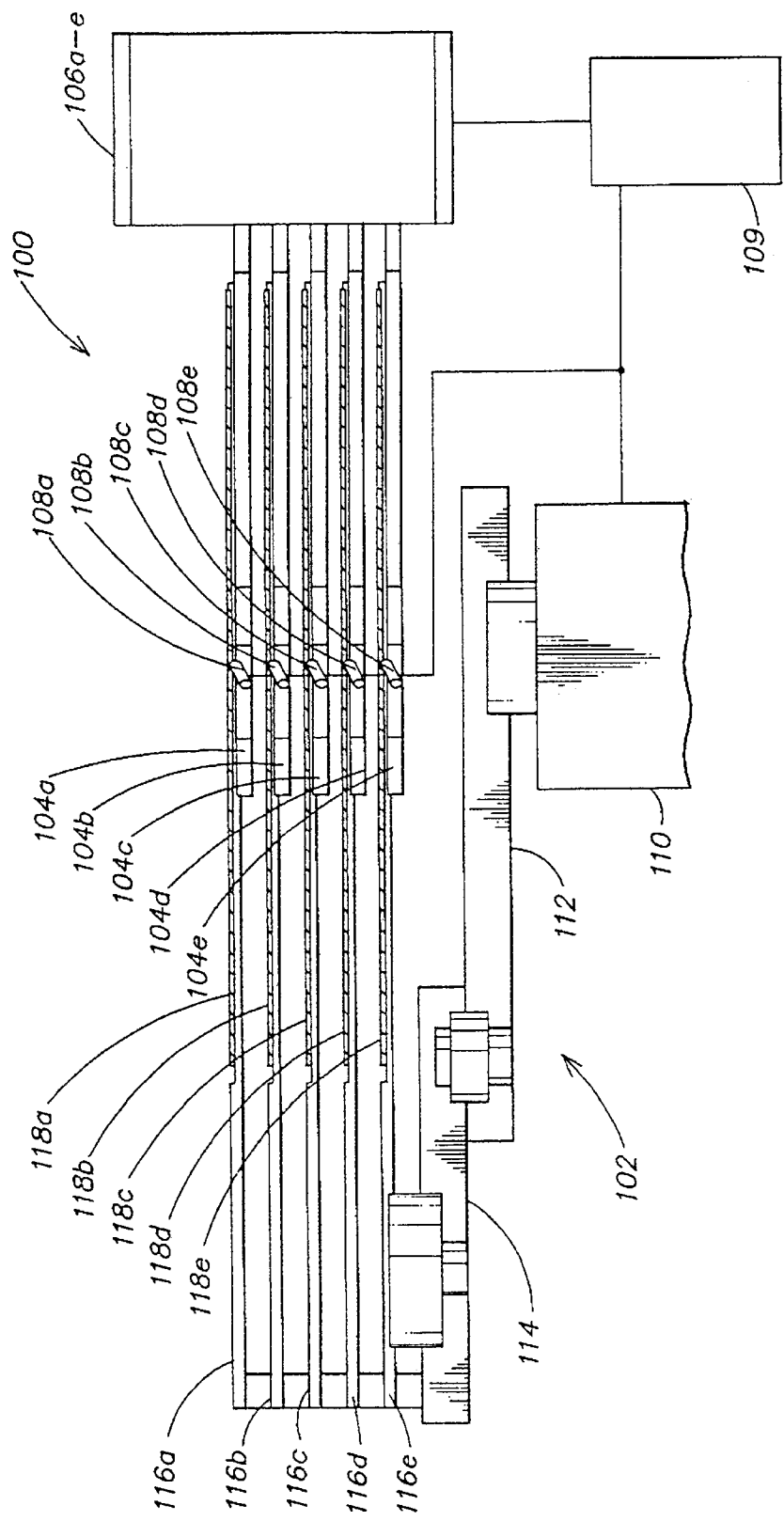

FIGS. 1A and 1B are a top plan view and a side elevational view, respectively, of an inventive multiple substrate orienter 100 configured in accordance with the present invention. For convenience, the multiple substrate orienter 100 is described with reference to semiconductor wafer handling equipment. However, it will be understood that the multiple substrate orienter 100 may be adapted to employ other substrate handling equipment (e.g., glass substrate handling equipment for flat panel displays, etc.).

As shown in FIGS. 1A and 1B, the multiple substrate orienter 100 comprises a rotatable substrate handler 102, a plurality of vertically stacked substrate supports 104*a–e* and a plurality of lift and lower mechanisms 106*a–e* coupled to the substrate supports 104*a–e*. A substrate orientation marking (SOM) detector 108*a–e* (e.g., a detector for determining the presence of a wafer notch or flat) is coupled to each substrate support 104*a–e*, respectively, as shown in FIG. 1B. A controller 109 is coupled to the rotatable substrate handler 102, to the lift and lower mechanisms 106*a–e* and to the SOM detectors 108*a–e* and includes program code (e.g., software) for controlling the operation of the multiple substrate orienter 100 as described below with reference to FIG. 3. The controller may comprise, for example, a dedicated controller for the multiple substrate orienter 100, a remote computer system for running a fabrication process, a manufacturing execution system, etc.

The rotatable substrate handler 102 includes a base 110 about which the entire wafer handler may rotate, a first extension 112 rotatably coupled to the base 110, a second extension 114 rotatably coupled to the first extension 112 and a plurality of substrate support portions 116*a–e* rotatably coupled to the second extension 114 but preferably fixedly coupled to one another so that the substrate support portions 116*a–e* move together as a unit. Each substrate support portion 116*a–e* preferably comprises a blade configuration (as shown by the substrate support portion 116*a* of FIG. 1A) having a width less than a diameter of a substrate 118*a–e* supported thereon. Each substrate support portion 116*a–e* further includes a gripper mechanism 120*a–e* for pressing against an edge of each substrate 118*a–e* to secure each substrate 118*a–e* during transport and/or to center each substrate 118*a–e* as is known in the art.

Each substrate support 104*a–e* preferably is configured to support a substrate near an edge of the substrate, such as via a first and second edge support 122*a–e*, 124*a–e* (FIG. 1A). In this manner, substrates 118*a–e* may be placed on the substrate supports 104*a–e* by the substrate support portions 116*a–e* without the substrate support portions 116*a–e* contacting or otherwise interfering with the substrate supports 104*a–e*.

The lift and lower mechanisms 106*a–e* are configured to individually lift and lower each substrate support 104*a–e* (e.g., each substrate support may be raised and lowered independently of the other substrate supports), and preferably comprise computer controllable, pneumatic cylinders that raise/lower under the influence of compressed air as is well known in the art. As described further below, the lift and lower mechanisms 106*a–e* alternatively may be coupled to the substrate support portions 116*a–e* (FIG. 1C) so as to allow each of the substrate support portions 116*a–e* to be individually raised and lowered instead of the substrate supports 104*a–e*.

Figure 2A:
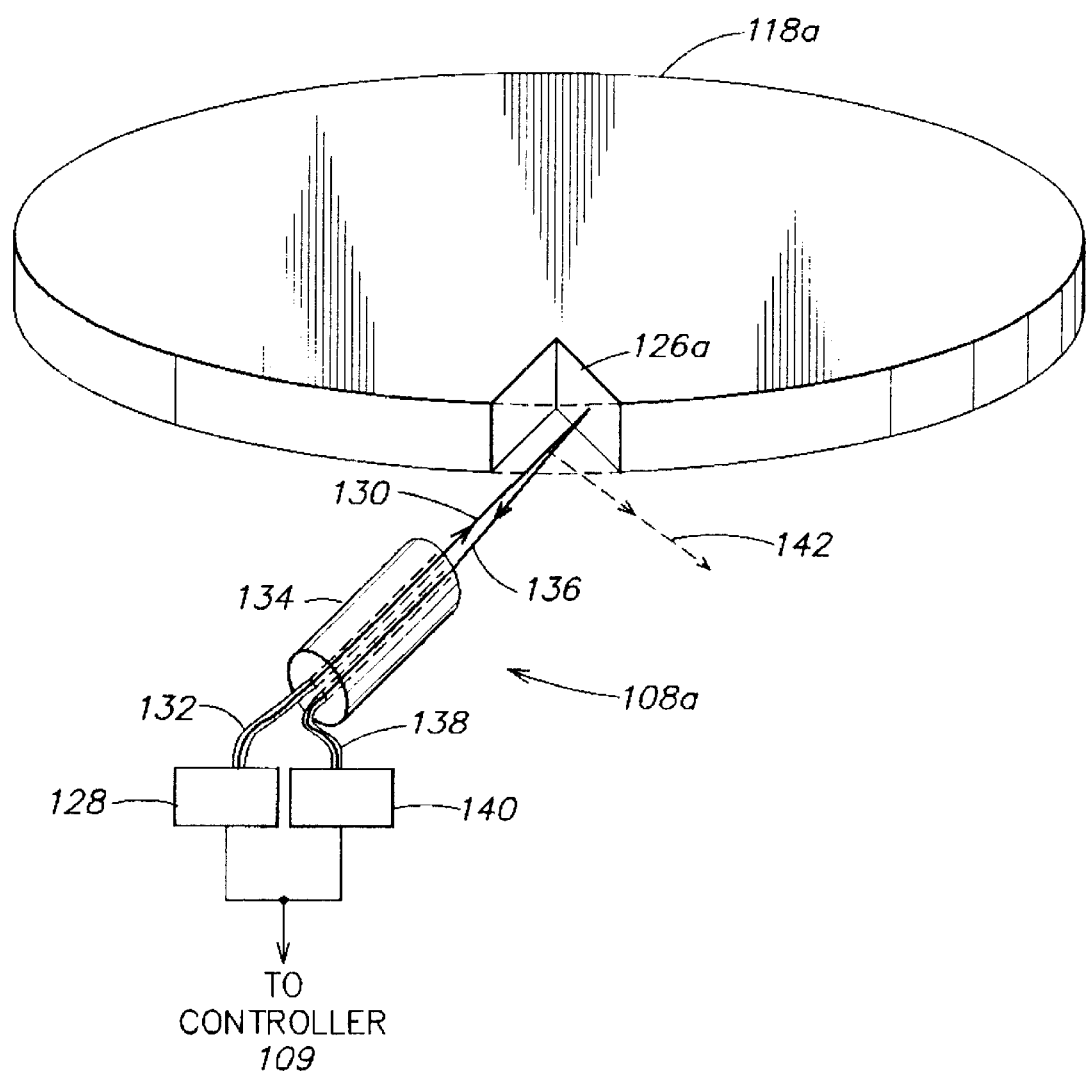
FIGS. 2A and 2B are perspective views of a preferred SOM detector for use with the multiple substrate orienter of FIGS. 1A and 1B or with the multiple substrate orienter of FIG. 1C.

The SOM detectors 108*a–e* may comprise any known detector for determining the presence or absence of a substrate orientation marking. However, for substrates employing a flat or a notch, the SOM detectors 108*a–e* preferably comprise fiber-optic-based sensors coupled to the second edge supports 124*a–e* of the substrate supports 104*a–e* as shown in FIGS. 1A and 1B. For example, FIG. 2A is a perspective view of the preferred SOM detector 108*a* of FIG. 1A when the substrate 118*a* comprises a notch 126*a* as a substrate orientation marking. The notch 126*a* typically has sidewalls at a 45° angle to a substrate diameter.

The SOM detector 108*a* comprises a laser source 128 (e.g., a laser diode such as a GaAs-based semiconductor laser diode) that outputs a laser beam 130. The laser beam 130 is directed toward the notch 126*a* via a first fiber optic cable 132 positioned (via a fiber optic support 134) so that the laser beam 130 exits the first fiber optic cable 132 and strikes the notch 126*a* if the substrate 118*a* is aligned with the detector 108*a* as shown. (The laser beam 130 preferably strikes the notch 126*a* approximately perpendicularly.

Figure 2B:
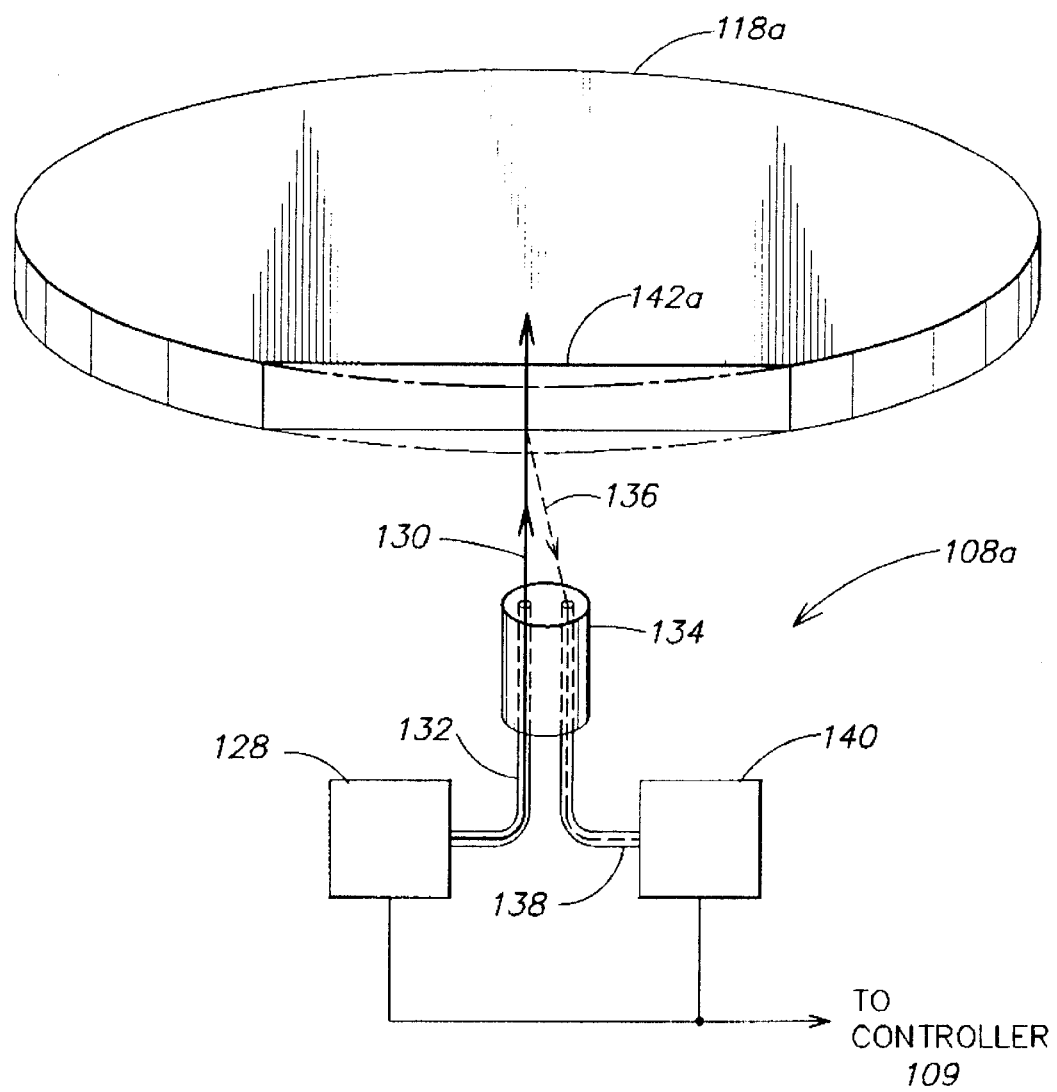

When the laser beam 130 strikes the notch 126*a*, a "collectable" reflected laser beam 136 is generated. The reflected laser beam 136 is collected by a second fiber optic cable 138 (also supported by the fiber optic support 134) and is transmitted thereby to a photodetector 140 (e.g., a silicon, junction based photodiode). However, if the substrate 118*a* is rotated so that the laser beam 130 does not strike the notch 126*a*, a "non-collectable" reflected laser beam 142 is generated and travels away from the second fiber optic cable 138 as shown in phantom. Accordingly, when the substrate 118*a* is oriented so that the laser beam 130 strikes the notch 126*a*, the photodetector 140 detects reflected light; otherwise, when the substrate 118*a* is oriented so that the laser beam 130 strikes another edge portion of the substrate 118*a*, the photodetector 140 does not detect reflected light. The SOM of the substrate 118*a* thereby is easily found by aligning the substrate 118*a* with the SOM detector 108*a* so that the laser beam 130 strikes the notch 126*a*. Note that the SOM detector 108*a* also may be configured so that reflected light is not detected by the photodetector 140 when the substrate 118*a*'s SOM is aligned with the SOM detector 108*a* but is detected when the substrate 118*a*'s SOM is not aligned with the SOM detector 108*a*. For example, FIG. 2B shows the SOM detector 108*a* positioned so that a collectible reflected light beam 136 is generated only when an SOM (shown as a flat 142*a* although a notch may be similarly detected) of the substrate 118*a* is not aligned with the SOM detector 108*a*. When the SOM of the substrate 118*a* is aligned with the SOM detector 108*a*, no reflected beam is generated as the laser beam 130 does not strike the substrate 118*a*. Note that the SOM detector 108*a* may be positioned above or below the substrate 118*a*.

Figure 3:
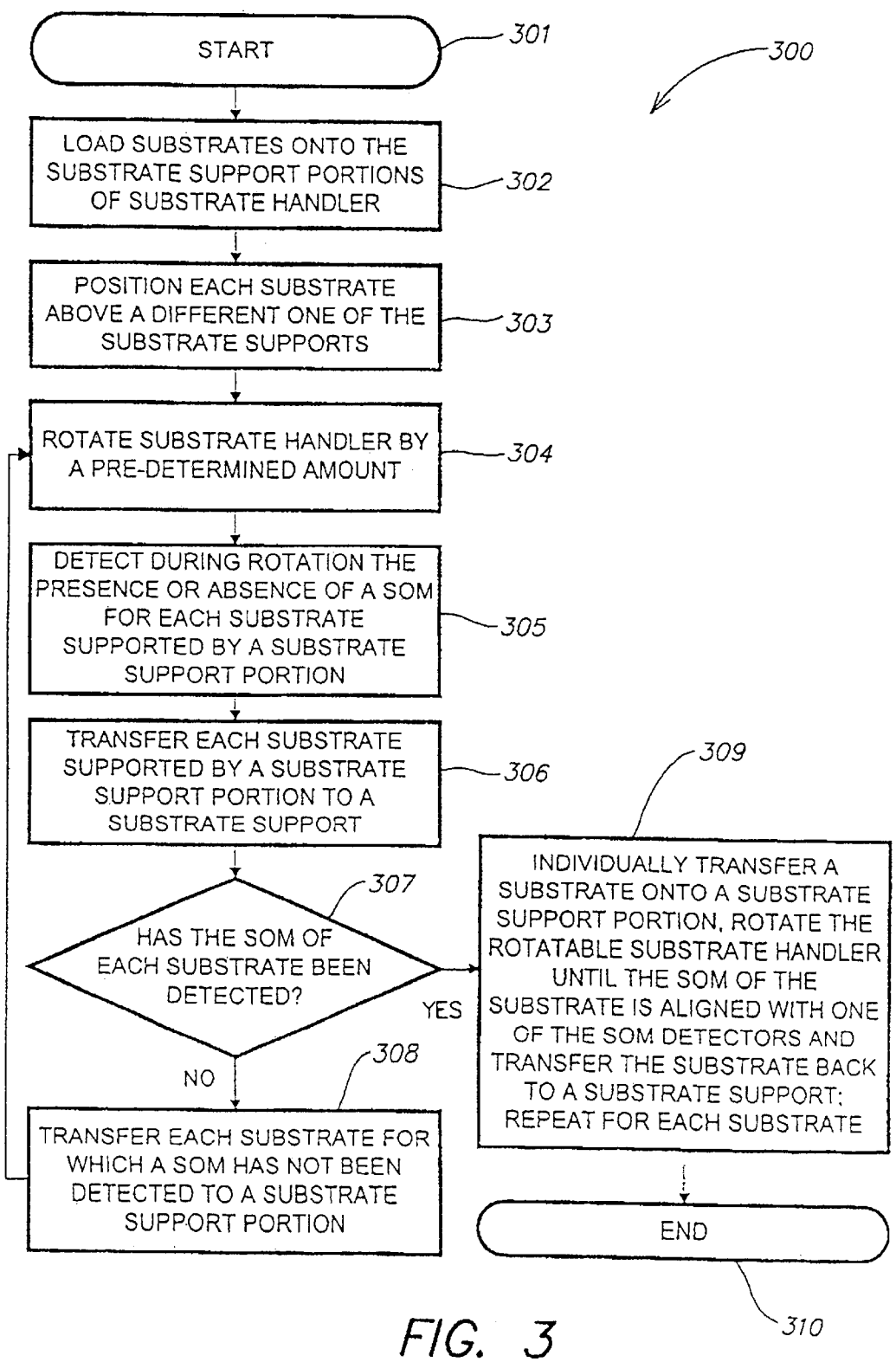
FIG. 3 is a flowchart of the preferred operation of the multiple substrate orienter of FIGS. 1A and 1B.

FIG. 3 is a flowchart 300 of the preferred operation of the multiple substrate orienter 100. Preferably, the controller 109 comprises program code for controlling the multiple substrate orienter 100 in accordance with the flowchart 300.

With reference to FIG. 3, in step 301, the operation of the multiple substrate orienter 100 begins. In step 302, a substrate is loaded onto each substrate support portion 116*a–e* of the rotatable substrate handler 102. For example, the rotatable substrate handler 102 may simultaneously load the substrates 118*a–e* onto the substrate support portions 116*a–e* by extending the first extension 112, the second extension 114 and/or the substrate support portions 116*a–e* so as to position the substrate support portions 116*a–e* under the substrates 118*a–e* (stored within a substrate carrier (not shown)), and by indexing the substrate-carrier to lower the substrates 118*a–e* onto the substrate support portions 116*a–e*.

In step 303, the first extension 112, the second extension 114 and/or the substrate support portions 116*a–e* retract as shown in FIGS. 1A and 1B to position each substrate 118*a–e* supported by the substrate support portions 116*a–e* above a different one of the substrate supports 104*a–e*. Thereafter, in step 304, the rotatable substrate handler 102 is rotated by a pre-determined amount, preferably by about 90° as limited primarily by contact between the substrate support portions 116*a–e* and the substrate supports 104*a–e*. During rotation of the rotatable substrate handler 102, in step 305, the presence or absence of a substrate orientation marking (e.g., a notch or a flat) is detected for each substrate 118*a–e* by employing the SOM detectors 108*a–e*. Specifically, the controller 109 monitors the photodetector 140 (e.g., via a photocurrent associated therewith) for either a presence or absence of detected light, depending on whether the configuration of FIG. 2A or the configuration of FIG. 2B is employed. If an SOM is detected for one of the substrates 118*a–e*, the controller 109 stores this information and preferably stores the angle the substrate is rotated past alignment with the SOM detector which detected the SOM. In this manner, those substrates for which an SOM is detected are "rough oriented", that is the controller 109 possesses information regarding the position of the substrate's SOM relative to an SOM detector (e.g., the SOM is within a certain number of degrees beyond the SOM detector). The rough oriented substrates may then (as described below with reference to steps 306–308) be supported by the substrate supports 104*a–e* while the remaining substrates 118*a–e* are rotated and rough oriented.

Specifically, in step 306, each substrate 118*a–e* is transferred to a different one of the substrate supports 104*a–e*. For example, the lift and lower mechanisms 106*a–e* may simultaneously or sequentially lift each of the substrate supports 104*a–e* a sufficient distance to transfer each substrate 118*a–e* onto a different one of the substrate supports 104*a–e*. Thereafter, in step 307, the controller 109 identifies the substrates for which an SOM has been detected (e.g., which substrates have been "completely" rough oriented) and the substrates for which an SOM has not been detected. While the substrates 118*a–e* are supported by the substrate supports 104*a–e*, the rotatable substrate handler 102 is rotated preferably in the opposite direction by the pre-determined amount (e.g., by about 90°) to reset the position of the rotatable substrate handler 102 for future rotations.

In step 308, each substrate for which an SOM has not been detected is transferred to a substrate support portion of the rotatable substrate handler 102. For example, each substrate support 104*a–e* which supports a substrate for which an SOM has not been detected is simultaneously or sequentially lowered (via the appropriate lift and lower mechanism 106*a–e*) a sufficient distance to transfer the substrate onto a substrate support portion of the rotatable substrate handler 102. Each substrate support 104*a–e* which supports a substrate for which an SOM has been detected is not lowered so that the substrate supported thereby is not rotated further during future rotations of the rotatable wafer handler 102. Thereafter, steps 304–308 are repeated until in step 307 an SOM has been detected for each of the substrates 118*a–e*. In this manner, in steps 301–308, each substrate is "simultaneously" (and preferably very rapidly) rough oriented to within a pre-determined angular distance (e.g., within 90°) of alignment with an SOM detector 108*a–e*.

With each substrate 118*a–e* rough oriented and supported by one of the substrate supports 104*a–e* (via step 306) (e.g., with the SOM of each substrate 118*a–e* detected), control passes to step 309. In step 309, each substrate 118*a–e* is individually "fine oriented". For example, to individually fine orient the first substrate 118*a*, the first substrate 118*a* is individually transferred to the first substrate support portion 116*a* of the rotatable substrate handler 102 (e.g., by lowering the first substrate support 104*a* with the first lift and lower mechanism 106*a* a sufficient distance to transfer the first substrate 118*a* onto the first substrate support portion 116*a*). Thereafter, the rotatable substrate handler 102 is rotated (e.g., preferably at a slower rate than the rotation rate employed during rough orientation to allow for more precise alignment, and typically in the opposite rotation direction to the rough orient direction) until the SOM of the first substrate 118*a* is aligned with the first SOM detector 108*a* (e.g., as signified by the reflected light measured by the photodetector 140). With the first substrate 118*a* "fine oriented", the first substrate 118*a* is transferred back to the first substrate support 104*a* (via the first lift and lower mechanism 106*a*) and the above process is repeated for the remaining substrates 118*b–e* to individually fine orient these substrates. Thereafter, with each substrate 118*a–e* fine oriented and stored by the substrate supports 104*a–e*, the operation of the multiple substrate orienter 100 ends in step 310. The oriented substrates 118*a–e* may be transferred to various processing chambers (not shown) via the rotatable substrate handler 102 or via another transfer mechanism for subsequent processing.

A significant advantage of the multiple substrate orienter 100 is that it "simultaneously" orients multiple substrates while occupying a small footprint. Most conventional semiconductor processing tools employ a rotatable wafer handler (e.g., such as the rotatable substrate handler 102) which may be employed for wafer orientation as described herein. By providing a vertically stacked (e.g., compact) arrangement of substrate supports, inexpensive pneumatic cylinders and SOM detectors, and additional substrate support portions for a pre-existing wafer handler, the multiple substrate orienter 100 may be formed within a very small footprint. Further, simultaneous orientation of multiple substrates significantly increases substrate throughput when compared to conventional, single substrate orientation techniques, thereby decreasing cost per unit substrate processed. A small footprint further decreases cost per unit substrate processed by reducing cleanroom space requirements.

Figure 1C:
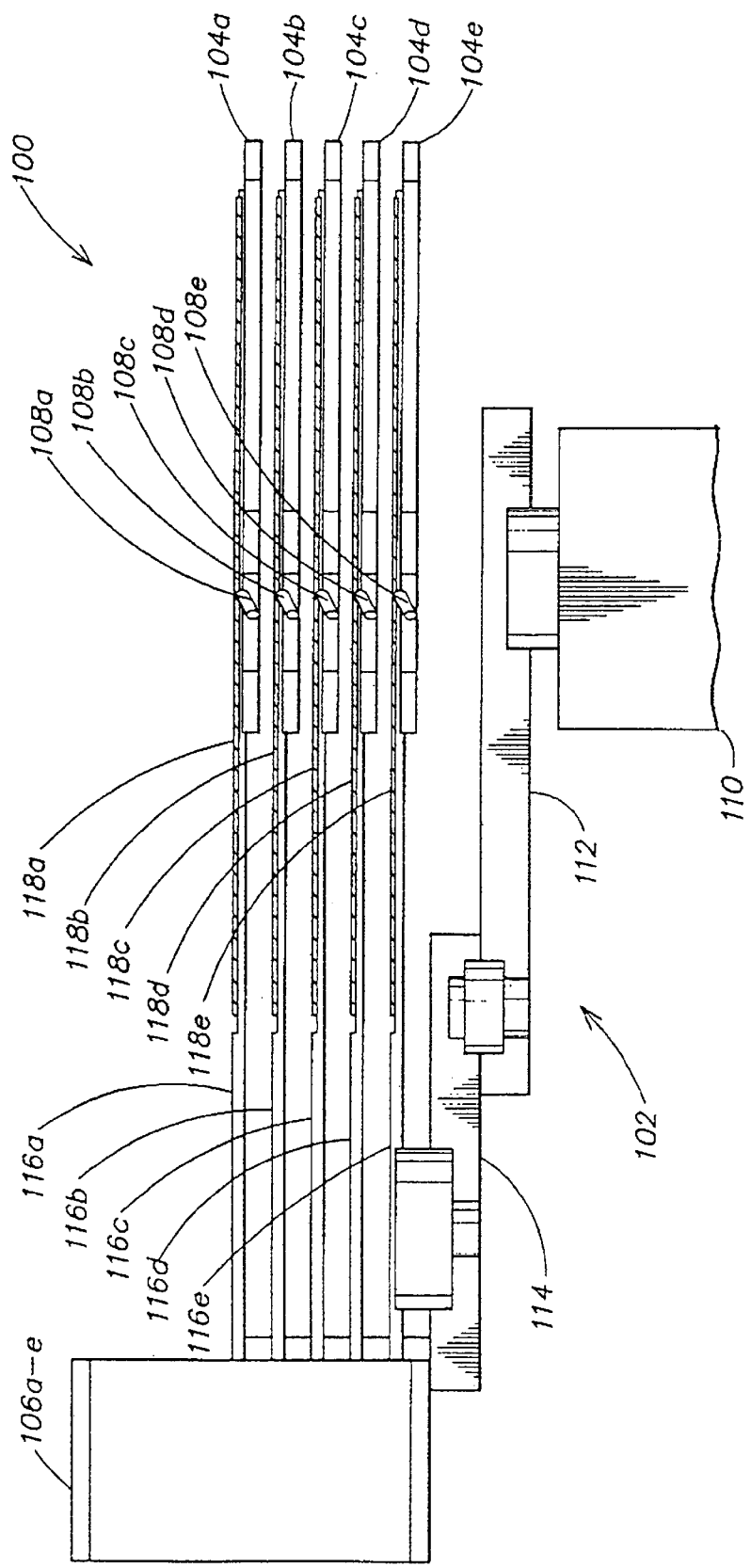
FIG. 1C is a side elevational view of an alternative embodiment of the multiple substrate orienter of FIGS. 1A and 1B.

The foregoing description discloses only the preferred embodiments of the invention, modifications of the above disclosed apparatus and method which fall within the scope of the invention will be readily apparent to those of ordinary skill in the art. For instance, while the multiple substrate orienter 100 has been described with reference to simultaneously orienting five substrates, it will be understood that any number of substrates (including only one substrate) may be so oriented. Further, instead of employing stationary substrate support portions for the rotatable substrate handler 102 and liftable/lowerable substrate supports as described with reference to FIGS. 1A and 1B, the lift and lower mechanisms 106*a–e* may be coupled to the substrate support portions 116*a–e* (as shown in FIG. 1C) rather than to the substrate supports 104*a–e* (as shown in FIGS. 1A and 1B). The substrate support portions 116*a–e* then may be lifted/lowered to perform the various individual/simultaneous substrate transfer operations described herein (e.g., substrate transfers between the substrate support portions 116*a–e* of the substrate handler and the substrate supports 104*a–e*). When only a single substrate is to be so oriented, the entire substrate handler may be lifted/lowered rather than just the substrate support portion and during the rough orient the substrate rotation may be stopped as soon as possible after SOM detection, which will result in faster fine orient times. Finally, although an extendable arm-type substrate handler is preferred, other types of substrate handlers may be

The invention claimed is:

1. A multiple substrate orienter comprising:
    a rotatable substrate handler having a plurality of substrate support portions, each adapted to support a substrate;
    a plurality of stacked substrate supports, each substrate support adapted to support a substrate;
    a plurality of substrate orientation marking (SOM) detectors, each SOM detector coupled to a different one of the substrate supports and adapted to identify a presence of an SOM of a substrate positioned close enough to the SOM detector to allow SOM detection by the SOM detector; and
    a plurality of lift and lower mechanisms, each lift and lower mechanism coupled to a different one of the substrate supports and adapted to individually lift and lower the different one of the substrate supports.

2. The multiple substrate orienter of claim 1 wherein each SOM detector comprises a fiber optic-based sensor adapted to detect a notch of a substrate.

3. The multiple substrate orienter of claim 1 wherein each SOM detector comprises a fiber optic-based sensor adapted to detect a flat of a substrate.

4. The multiple substrate orienter of claim 1 wherein each lift and lower mechanism comprises a pneumatic cylinder.

5. The multiple substrate orienter of claim 1 wherein each substrate support portion of the rotatable substrate handler comprises a blade having a width less than a diameter of a substrate to be supported by the substrate support portion.

6. The multiple substrate orienter of claim 5 wherein each substrate support of the stacked substrate supports is adapted to support a substrate near an edge of the substrate so as not to contact a substrate support portion of the rotatable substrate handler during placement of a substrate on the substrate support by the substrate support portion of the rotatable substrate handler.

7. The multiple substrate orienter of claim 1 further comprising a controller coupled to the rotatable substrate handler, to the plurality of SOM detectors and to the plurality of lift and lower mechanisms, the controller having program code adapted to:
    simultaneously rough orient a plurality of substrates loaded onto the substrate support portions of the rotatable substrate handler; and
    individually fine orient each rough oriented substrate.

8. The apparatus of claim 7 wherein the controller's program code is adapted to simultaneously rough orient a plurality of substrates loaded onto the substrate support portions of the rotatable substrate handler by simultaneously orienting an SOM of each substrate to within approximately 90° rotation of alignment with one of the SOM detectors.

9. The apparatus of claim 7 wherein the controller's program code is adapted to individually fine orient each rough oriented substrate by individually rotating each rough oriented substrate so that an SOM of each substrate is aligned with one of the SOM detectors.

10. The multiple substrate orienter of claim 1 further comprising a controller coupled to the rotatable substrate handler, to the plurality of SOM detectors and to the plurality of lift and lower mechanisms, the controller having program code adapted to:
    a) position each of a plurality of substrates, each supported by a different one of the substrate support portions of the rotatable substrate handler, above a different one of the substrate supports of the substrate support stack;
    b) rotate the rotatable substrate handler by a pre-determined amount;
    c) detect during rotation the presence or absence of an SOM of each substrate supported by a substrate support portion of the rotatable substrate handler;
    d) transfer each substrate supported by a substrate support portion of the rotatable substrate handler from its substrate support portion to a substrate support of the stacked substrate supports;
    e) determine if the SOM of each substrate has been detected, and if not:
    f) transfer each substrate support that supports a substrate for which an SOM has not been detected to a substrate support portion of the rotatable substrate handler; and
    g) repeat b)–f) until the SOM of each substrate has been detected.

11. The multiple substrate orienter of claim 10 wherein the pre-determined amount is approximately 90°.

12. The multiple substrate orienter of claim 10 wherein the controller has additional program code adapted to:
    h) once the SOM of each substrate has been detected, for each substrate supported by a substrate support of the substrate support stack, individually transfer each substrate onto a substrate support portion of the rotatable substrate handler and rotate the rotatable substrate handler until the SOM of the substrate is aligned with one of the SOM detectors.

13. The multiple substrate orienter of claim 12 wherein the rotation during b) occurs at a higher rate than the rotation during h).

14. A multiple substrate orienter comprising:
    a rotatable substrate handler having a plurality of substrate support portions, each adapted to support a substrate;
    a plurality of stacked substrate supports, each substrate support adapted to support a substrate;
    a plurality of substrate orientation marking (SOM) detectors, each SOM detector coupled to a different one of the substrate supports and adapted to identify a presence of an SOM of a substrate positioned close enough to the SOM detector to allow SOM detection by the SOM detector; and
    a plurality of lift and lower mechanisms, each lift and lower mechanism coupled to a different one of the substrate support portions of the rotatable substrate handler and adapted to individually lift and lower the different one of the substrate support portions.

15. The multiple substrate orienter of claim 14 further comprising a controller coupled to the rotatable substrate handler, to the plurality of SOM detectors and to the plurality of lift and lower mechanisms, the controller having program code adapted to:
    simultaneously rough orient a plurality of substrates loaded onto the substrate support portions of the rotatable substrate handler; and
    individually fine orient each rough oriented substrate.

16. The multiple substrate orienter of claim 14 wherein each substrate support portion of the rotatable substrate handler comprises a blade having a width less than a diameter of a substrate to be supported by the substrate support portion.

17. The multiple substrate orienter of claim 16 wherein each substrate support of the stacked substrate supports is adapted to support a substrate near an edge of the substrate so as not to contact a substrate support portion of the rotatable substrate handler during placement of a substrate on the substrate support by the substrate support portion of the rotatable substrate handler.

18. A substrate orienter comprising:
   a rotatable substrate handler having a substrate support portion adapted to support a substrate;
   a substrate support adapted to support a substrate;
   a substrate orientation marking (SOM) detector coupled to the substrate support and adapted to identify a presence of an SOM of a substrate positioned close enough to the SOM detector to allow SOM detection by the SOM detector;
   a lift and lower mechanism coupled to the substrate support and adapted to lift and lower the substrate support; and
   a controller coupled to the rotatable substrate handler, to the SOM detector and to the lift and lower mechanism, the controller having program code adapted to:
      rough orient a substrate loaded onto the substrate support portion of the rotatable substrate handler while rotating the substrate in a first direction; and
      fine orient the rough oriented substrate while rotating the substrate in a second direction that is opposite to the first direction.

19. A substrate orienter comprising:
   a rotatable substrate handler having a substrate support portion adapted to support a substrate;
   a substrate support adapted to support a substrate;
   a substrate orientation marking (SOM) detector coupled to the substrate support and adapted to identify a presence of an SOM of a substrate positioned close enough to the SOM detector to allow SOM detection by the SOM detector;
   a lift and lower mechanism coupled to the rotatable substrate handler and adapted to lift and lower at least the substrate support portion of the rotatable substrate handler; and
   a controller coupled to the rotatable substrate handler, to the SOM detector and to the lift and lower mechanism, the controller having program code adapted to:
      rough orient a substrate loaded onto the substrate support portion of the rotatable substrate handler; and
      fine orient the rough oriented substrate.

20. The substrate orienter of claim 19, wherein the controller causes the substrate to be rotated in a first direction while rough orienting the substrate, and causes the substrate to be rotated in a second direction opposite to the first direction while fine orienting the substrate.

* * * * *